United States Patent
Lin et al.

(10) Patent No.: US 11,739,423 B2
(45) Date of Patent: *Aug. 29, 2023

(54) ATOMIC LAYER DEPOSITION APPARATUS FOR COATING ON FINE POWDERS

(71) Applicant: SKY TECH INC., Hsinchu County (TW)

(72) Inventors: Jing-Cheng Lin, Hsinchu County (TW); Jung-Hua Chang, Hsinchu County (TW); Ta-Hao Kuo, Hsinchu County (TW); Chia-Cheng Ku, Hsinchu County (TW)

(73) Assignee: SKY TECH INC., Hsinchu County (TW)

(*) Notice: Subject to any disclaimer, the term of this patent is extended or adjusted under 35 U.S.C. 154(b) by 67 days.

This patent is subject to a terminal disclaimer.

(21) Appl. No.: 17/199,306

(22) Filed: Mar. 11, 2021

(65) Prior Publication Data
US 2022/0106685 A1 Apr. 7, 2022

(30) Foreign Application Priority Data
Oct. 6, 2020 (TW) ................................ 10913465.6

(51) Int. Cl.
*C23C 16/455* (2006.01)
*C23C 16/44* (2006.01)
*C23C 16/442* (2006.01)

(52) U.S. Cl.
CPC .... *C23C 16/45544* (2013.01); *C23C 16/4412* (2013.01); *C23C 16/4417* (2013.01); *C23C 16/442* (2013.01)

(58) Field of Classification Search
None
See application file for complete search history.

(56) References Cited

U.S. PATENT DOCUMENTS

| 5,003,919 | A | * | 4/1991 | Yamamoto | ............. | B22F 1/145 |
| | | | | | | 118/716 |
| 2011/0003088 | A1 | * | 1/2011 | Honda | ........................ | B01J 2/12 |
| | | | | | | 118/723 E |
| 2012/0085284 | A1 | * | 4/2012 | Dassel | ................... | C23C 16/442 |
| | | | | | | 118/716 |
| 2013/0059073 | A1 | * | 3/2013 | Jiang | ................. | C04B 35/62222 |
| | | | | | | 118/715 |

(Continued)

*Primary Examiner* — Karla A Moore
(74) *Attorney, Agent, or Firm* — Chun-Ming Shih; HDLS IPR Services

(57) ABSTRACT

An atomic layer deposition apparatus for coating particles is disclosed. The atomic layer deposition apparatus includes a vacuum chamber, a shaft sealing device, and a driving unit. The driving unit is connected to and drives the vacuum chamber to rotate through the shaft sealing device. The vacuum chamber includes a reaction space for accommodating a plurality of particles, wherein the reaction space has a polygonal columnar shape or a wavy circular columnar shape. An air extraction line and an air intake line are fluidly connected to the vacuum chamber, and the air intake line is used to transport a precursor gas and a non-reactive gas to the reaction space. Through the special shape of the reaction space together with the non-reactive gas, the particles in the reaction space can be effectively stirred to form a thin film with a uniform thickness on the surface of each particle.

10 Claims, 7 Drawing Sheets

(56) References Cited

U.S. PATENT DOCUMENTS

| | | | | |
|---|---|---|---|---|
| 2015/0125599 A1* | 5/2015 | Lindfors | ........... | C23C 16/45555 |
| | | | | 118/716 |
| 2016/0369396 A1* | 12/2016 | Sammelselg | ..... | C23C 16/45555 |
| 2017/0073807 A1* | 3/2017 | Kostamo | ........... | C23C 16/45555 |
| 2017/0327948 A1* | 11/2017 | Dadheech | ........... | C23C 16/4417 |
| 2022/0106682 A1* | 4/2022 | Lin | ..................... | C23C 16/4557 |
| 2022/0106684 A1* | 4/2022 | Lin | ................... | C23C 16/45574 |
| 2022/0106686 A1* | 4/2022 | Lin | ..................... | C23C 16/4557 |
| 2022/0136103 A1* | 5/2022 | Lin | ................... | C23C 16/45544 |
| | | | | 118/719 |
| 2022/0162750 A1* | 5/2022 | Lin | ..................... | C23C 16/4417 |
| 2022/0341036 A1* | 10/2022 | Lin | ................... | C23C 16/45525 |
| 2023/0120393 A1* | 4/2023 | Lin | ................... | C23C 16/45544 |
| | | | | 118/715 |

* cited by examiner

ATOMIC LAYER DEPOSITION APPARATUS FOR COATING ON FINE POWDERS

TECHNICAL FIELD

The present disclosure relates to an atomic layer deposition apparatus for coating particles, more particularly, to an atomic layer deposition apparatus with a reaction space that has a polygonal columnar shape or a wavy circular columnar shape so that particles in the reaction space are effectively stirred by non-reactive gas delivered to the reaction space, thereby enhancing a formation of thin films with uniform thickness on the surface of particles.

BACKGROUND

Nanoparticle is generally defined as a particle that is smaller than 100 nanometers in at least one dimension, and in comparison to macroscopic matter, nanoparticle is completely different in both physical and chemical properties. Broadly speaking, the physical property of macroscopic matter is unrelated to its size, but the same cannot be said for nanoparticle. Nanoparticles are now being studied for potential applications in biomedical, optical, and electronic fields.

Quantum dot is a semiconductor nanoparticle and the semiconductor material currently being studied includes materials in groups II~VI like ZnS, CdS, CdSe, etc, in which CdSe is the most promising. The size of Quantum dot is usually between 2 to 50 nanometers. Electron in the quantum dot absorbs energy after being irradiated by ultra-violet light and transitions from valence band to conductance band. When the stimulated electron returns to the valence band from the conductance band, it releases the energy by emission of light.

The energy gap of a quantum dot is associated to its size, wherein the larger the size of a quantum dot, the smaller the energy gap which in turn emits light with longer wavelength after radiation, and the smaller the size of a quantum dot, the larger the energy gap which in turn emits light with shorter wavelength after radiation. For example, a quantum dot of 5 to 6 nanometers emits orange or red light, whereas a quantum dot of 2 to 3 nanometers emits blue or green light; the light color is, of course, determined by the material composition of the quantum dot.

Light generated by light emitting diode (LED) that utilizes quantum dots is near continuous spectrum and has good color rendering, which are beneficial in improving the luminous quality of LED. In addition, the wavelength of the emitted light can be adjusted by changing the size of quantum dot. Therefore quantum dots have become a main focus in developing the next generation of light-emitting devices and displays.

Although quantum dots have the aforementioned advantages and properties, agglomeration of the quantum dots occurs easily during manufacturing process. Moreover, quantum dots have higher surface activities and are prone to react with air and water vapor, which are factors that shorten the life cycle of nanoparticles.

In particular, agglomeration occurs when the quantum dots are being manufactured as sealant for LED and thereby decreasing the optical performance of quantum dots. Further, after the quantum dots are made as the sealant of LED, it is still possible for surrounding oxygen or water vapor to penetrate through the sealant and come in contact with the surface of the quantum dots, thereby causing the quantum dots to be oxidized and affecting the efficacy or life cycle of the quantum dots and LED. The surface defects and dangling bonds of the quantum dots may also cause non-radiative recombination, which also affects the luminous efficiency of quantum dots.

Atomic layer deposition (ALD) is a process currently used by industries to form a thin film with nanometer thickness or a plurality of thin films, on the surface of the quantum dots to form a quantum well.

ALD process can form a thin film with a uniform thickness on a substrate with precision in controlling the thickness of the thin film, and so in theory ALD process could also be applicable to three-dimensioned quantum dots. When the quantum dots sit on a support pedestal, contacts exist between adjacent quantum dots, and these contacts cannot be reached by precursor gas of ALD. Thus, thin films with uniform thickness cannot be formed on the surface of all nanoparticles.

SUMMARY

To solve the aforementioned issues, the present disclosure provides an atomic layer deposition apparatus for coating particles that has a reaction space with specially designed shape, by which non-reactive gas introduced to the reaction space is capable of fully agitating particles, so as to coat a thin film with a uniform thickness on the surface of each particle.

An object of the present disclosure is to provide an atomic layer deposition apparatus for coating particles, mainly including a driving unit, a shaft sealing device, and a vacuum chamber, wherein through the shaft sealing device, the driving unit is connected to the vacuum chamber and drives the vacuum chamber to rotate. The vacuum chamber has a reaction chamber for accommodating a plurality of particles, and the reaction chamber has a polygonal columnar shape or a wavy circular columnar shape. When the vacuum chamber rotates and non-reactive gas is delivered to the reaction space, the particles in the reaction space are completely and evenly stirred and agitated to prevent agglomeration of the particles and to enhance the formation of a thin film with uniform thickness on the surfaced of each particle.

An object of the present disclosure is to provide an atomic layer deposition apparatus for coating particles that mainly disposes at least one air extraction line, at least one air intake line, at least one non-reactive gas line, at least one heater and/or at least one temperature sensing device in the shaft sealing device. The air extraction line is used to extract gas from the reaction space, and the air intake line is used to transport a precursor gas and/or a non-reactive gas to the reaction space for forming thin films on the surface of particles. During ALD process, the particles are stirred and spread out to all regions in the reaction space due to the rotated vacuum chamber by the driving unit and, the non-reactive gas delivered to the reaction space by the air intake line or the non-reactive gas line, in addition to the special-shaped reaction space. Thus, a thin film with uniform thickness is more likely to be formed on the surface of each particle.

An object of the present disclosure is to provide an atomic layer deposition apparatus for coating particles that mainly includes a driving unit, a shaft sealing device, and a vacuum chamber. The driving unit is connected to the vacuum chamber and drives the vacuum chamber to rotate, via the shaft sealing device. The vacuum chamber includes a cover lid and a chamber. When the cover lid covers the chamber, a reaction space with polygonal columnar shape or wavy circular columnar shape is formed between the cover lid and the chamber, for contributing in spreading particles to various areas of the reaction space.

To achieve the aforementioned objects, the present disclosure provides an atomic layer deposition apparatus for coating particles, which includes a vacuum chamber, a shaft sealing device, a driving unit, at least one air extraction line, and at least one air intake line. The vacuum chamber includes a reaction space for accommodating a plurality of particles, and the reaction space has a polygonal columnar shape. Via the shaft sealing device, the driving unit is connected to the vacuum chamber and drives the vacuum chamber to rotate for agitating the particles in the reaction space. The air extraction line is fluidly connected to the reaction space of the vacuum chamber for extracting a gas in the reaction space. The air intake line is fluidly connected to the reaction space of the vacuum chamber for transporting a precursor or a non-reactive gas to the reaction space, wherein the non-reactive gas is used for blowing the particles around in the reaction space.

The present disclosure provides an atomic layer deposition apparatus for coating particles, which includes a vacuum chamber, a shaft sealing device, a driving unit, at least one air extraction line, and at least one air intake line. The vacuum chamber includes a reaction space for accommodating a plurality of particles and the reaction space has a wavy circular columnar shape. The driving unit is connected to the vacuum chamber and drives the vacuum chamber to rotate, via the shaft sealing device. The air extraction line is fluidly connected to the reaction space of the vacuum chamber for extracting a gas in the reaction space. The air intake line is fluidly connected to the reaction space of the vacuum chamber for transporting a precursor or a non-reactive gas to the reaction space, wherein the non-reactive gas is used for blowing the particles around in the reaction space.

Preferably, the vacuum chamber includes a cover lid and a chamber. The cover lid has a polygonal recess disposed on an inner surface of the cover lid, and the chamber has a polygonal space. The polygonal recess of the cover lid and the polygonal space of the chamber form a void with polygonal columnar shape.

Preferably, the air intake line includes at least one non-reactive gas line fluidly connected to the reaction space of the vacuum chamber for transporting the non-reactive gas to the reaction space of the vacuum chamber so as to blow the particles around in the reaction space.

Preferably, the shaft sealing device includes an outer tube and an inner tube, wherein the outer tube has an accommodating space for accommodating the inner tube, and the inner tube has a connection space for accommodating the air extraction line, the air intake line, and the non-reactive gas line.

Preferably, a part of the inner tube extends from the accommodating space of the outer tube to the reaction space of the vacuum chamber, and forming a protruding tube part.

Preferably, the vacuum chamber includes a cover lid and a chamber. The cover lid has a wavy circular recess disposed on an inner surface of the cover lid, and the chamber has a wavy circular space. The polygonal recess of the cover lid and the polygonal space of the chamber form a void with wavy circular columnar shape.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
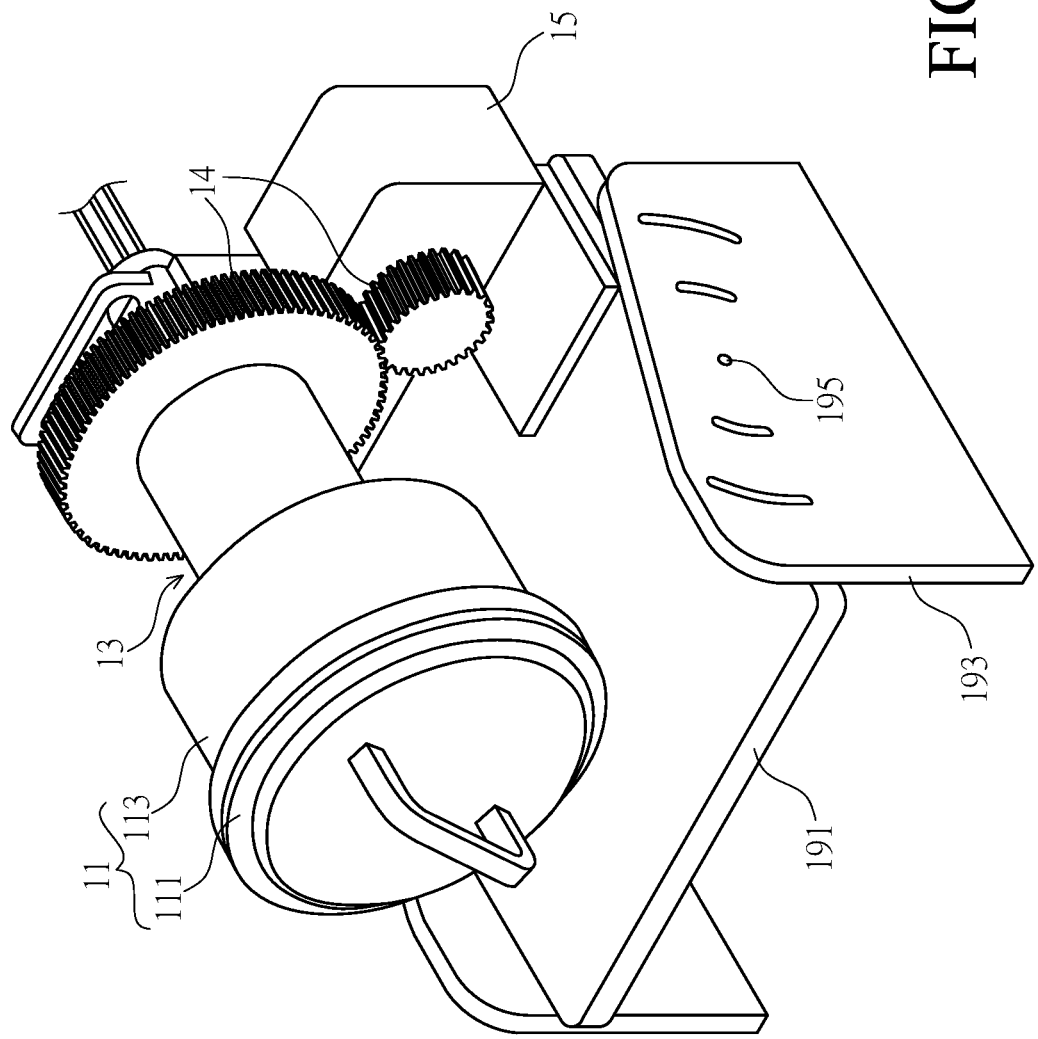
FIG. 1 is a schematic diagram of an atomic layer deposition apparatus for coating particles according to an embodiment of the present disclosure.

Referring to FIG. 1, FIG. 2, FIG. 3 and FIG. 4, an atomic layer deposition apparatus 10 for coating particles includes a vacuum chamber 11, a shaft sealing device 13, and a driving unit 15. As shown in the figures, the driving unit 15 is connected to the vacuum chamber 11 via the shaft sealing device 13 and in turn drives the vacuum chamber 11 to rotate.

The vacuum chamber 11 has a reaction space 12 for accommodating a plurality of particles 121 such as quantum dots. The quantum dots may be made of semiconductor material like ZnS, CdS, CdSe, etc in groups II~VI, and a thin film formed on each of the quantum dots may be aluminum oxide ($Al_2O_3$). As the embodiment shown in FIG. 4, the vacuum chamber 11 includes a cover lid 111 and a chamber 113, and the reaction space 12 within the vacuum chamber 11 has a wavy circular columnar shape.

Figure 3:
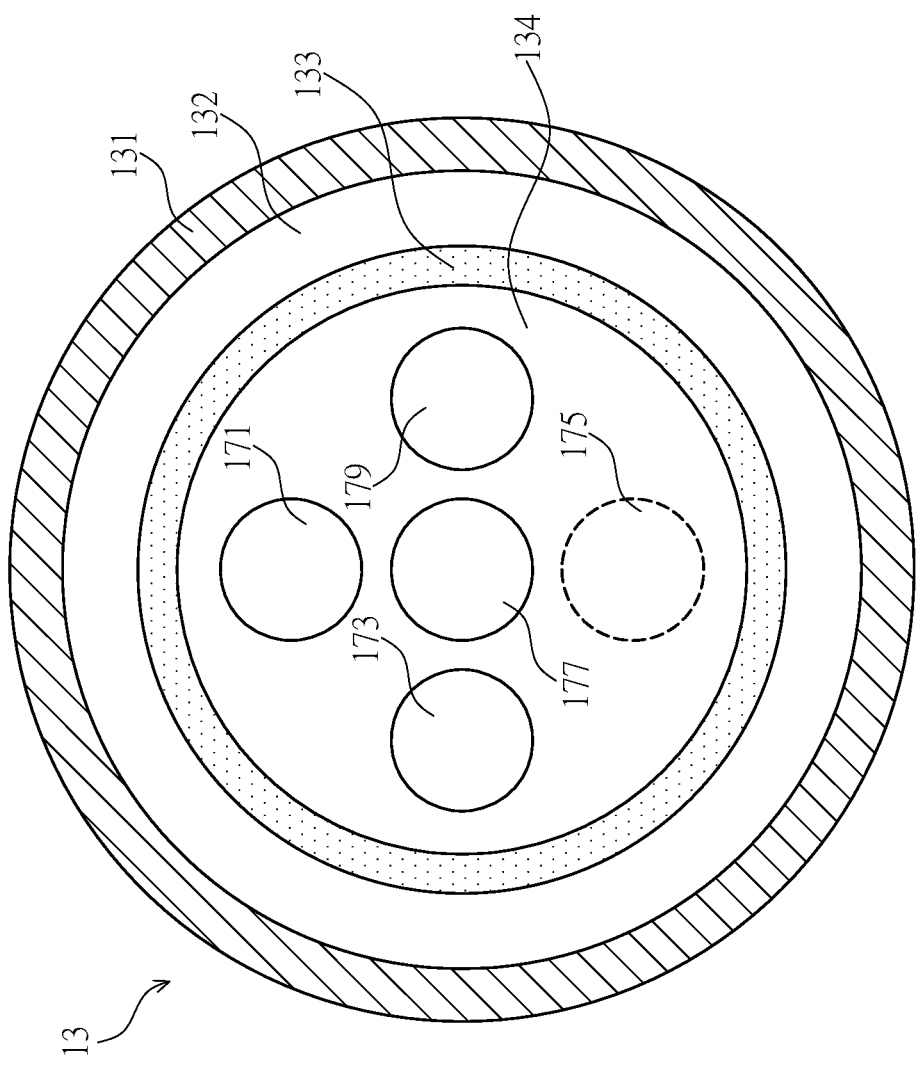
FIG. 3 is a cross-sectional schematic diagram of a partial structure of an atomic layer deposition apparatus for coating particles according to an embodiment of the present disclosure.

At least one air extraction line 171, at least one air intake line 173 and/or at least one non-reactive gas line 175 are fluidly connected to the reaction space 12 of the vacuum chamber 11. For Example, the air extraction line 171, the air intake line 173, the non-reactive gas line 175, a heater 177 and/or a temperature sensing unit 179 may be disposed in the shaft sealing device 13 as shown in FIG. 3. The air extraction line 171 is fluidly connected to the reaction space 12 of the vacuum chamber 11 and is used to extract gas from the reaction space 12 to create vacuum in the reaction space 12 for subsequent ALD process. In particular, the air extraction line 171 can connect to a pump and use the pump to extract the gas in the reaction space 12.

The air intake line 173 is fluidly connected to the reaction space 12 of the vacuum chamber 11 and is used to transport/deliver a precursor or a non-reactive gas to the reaction space 12. The air intake line 173 can, for example, be connected to a precursor storage tank and a non-reactive gas storage tank via a valve set, and through the valve set, transport the precursor gas to the reaction space 12 for the precursor gas to be deposited on the surface of the particles 121. In practical application, the air intake line 173 may send a carrier gas together with the precursor gas to the reaction space 12. Then, the air intake line 173 transports the non-reactive gas to the reaction space 12 through the valve set in addition to the air extraction line 171 extracting gas from the reaction space 12, to remove unreacted precursor gas in the reaction space 12. In one embodiment, the air intake line 173 is connected to a plurality of branch lines and transports different precursor gases to the reaction space 12 sequentially through the respective branch lines.

The air intake line 173 is also capable of increasing a flow of non-reactive gas delivered to the reaction space 12, so as to blow the particles 121 around in the reaction space 12 by the non-reactive gas, such that the particles 121 are carried by the non-reactive gas and diffused to various areas and all regions of the reaction space 12.

In one embodiment, the air intake line 173 includes the at least one non-reactive gas line 175, wherein the non-reactive gas line 175 is fluidly connected to the reaction space 12 of the vacuum chamber 11 and is used to transport a non-reactive gas to the reaction space 12. The non-reactive gas line 175 can, for example, be connected to a nitrogen storage tank via a valve set, and through the valve set, transport nitrogen to the reaction space 12. The non-reactive gas is used to blow the particles 121 around in the reaction space 12, and in combination with the rotating of the vacuum chamber 11 driven by the driving unit 15, the particles 121 in the reaction space 12 are effectively and evenly stirred and agitated, thereby contributing in forming a thin film with a uniform thickness on the surface of each particle 121.

The air intake line 173 and the non-reactive gas line 175 of the atomic layer deposition apparatus 10 for coating particles are both used to transport non-reactive gas to the reaction space 12. The flow of non-reactive gas transported by the air intake line 173 is smaller as the main purpose of which is for removing the precursor gas in the reaction space 12, whereas the flow of non-reactive gas transported by the non-reactive gas line 175 is larger and is mainly used to blow the particles 121 around in the reaction space 12. The non-reactive gas transported by the air intake line 173 and by the non-reactive gas line 175 may be the same gas or may be different gases.

The timings at which the air intake line 173 and the non-reactive gas line 175 transport the non-reactive gas to the reaction space 12 are different. Hence, the non-reactive gas line 175 may be omitted in practical application, and instead, the flow of non-reactive gas transported by the air intake line 173 at different timings is adjusted. More specifically, when removing the precursor gas from the reaction space 12, the flow of non-reactive gas being transported to the reaction space 12 by the air intake line 173 is lowered, and when blowing the particles 121 around in the reaction space 12, the flow of non-reactive gas being transported to the reactions space 12 by the air intake line 173 is enlarged.

In one embodiment, the shaft sealing device 13 includes an outer tube 131 and an inner tube 133, wherein the outer tube 131 has an accommodating space 132 and the inner tube 133 has a connection space 134. The outer tube 131 and the inner tube 133 may, for example, be hollow columnar objects or have a hollow columnar space within. The accommodating space 132 of the outer tube 131 is used to accommodate the inner tube 133, and the outer tube 131 and the inner tube 133 are configured to be coaxial.

The shaft sealing device 13 as described in the present disclosure may be a common shaft seal or a magnetic fluid shaft seal that is mainly used for isolating the reaction space 12 of the vacuum chamber 11 from outer spaces to maintain vacuum in the reaction space 12.

In one embodiment of the present disclosure, a filter unit 139 is disposed at one end of the inner tube 133 that is connected to the reaction space 12. The air extraction line 171 is fluidly connected to the reaction space 12 via the filter unit 139, and extracts the gas from the reaction space 12 to pass through the filter unit 139. The filter unit 139 is mainly used to filter the particles 121 in the reaction space 12 to prevent the particles 121 from entering the air extraction line 171 during gas extraction and causing a loss of the particles 121.

The driving unit 15 is mechanically connected to the vacuum chamber 11 via the outer tube 131, and drives the vacuum chamber 11 to rotate through the outer tube 131. The driving unit 15 is not connected to the inner tube 133, therefore when the driving unit 15 drives the outer tube 131 and the vacuum chamber 11 to rotate, the inner tube 133 does not rotate along therewith, which in turn keeps a stable extraction or supply of gas by the air extraction line 171, the air intake line 173 and/or the non-reactive gas line 175 in the inner tube 133.

The driving unit 15 may drive the outer tube 131 and the vacuum chamber 11 to rotate continuously in one direction, like clockwise or counterclockwise. In different embodiments, the driving unit 15 may drive the outer tube 131 and the vacuum chamber 11 to rotate in the clockwise direction by a specific angle, and then in the counterclockwise direction by the specific angle; the angle is, for example, 360 degrees. As the vacuum chamber 11 rotates, the particles 121 in the reaction space 12 are stirred and agitated, which in turn helps the particles 121 to come in contact with a precursor gas.

In one embodiment, the driving unit 15 is a motor, which is connected to the outer tube 131 via a gear 14, and through the gear 14, drives the outer tube 131 and the vacuum chamber 11 to rotate relative to the inner tube 133.

Figure 2:
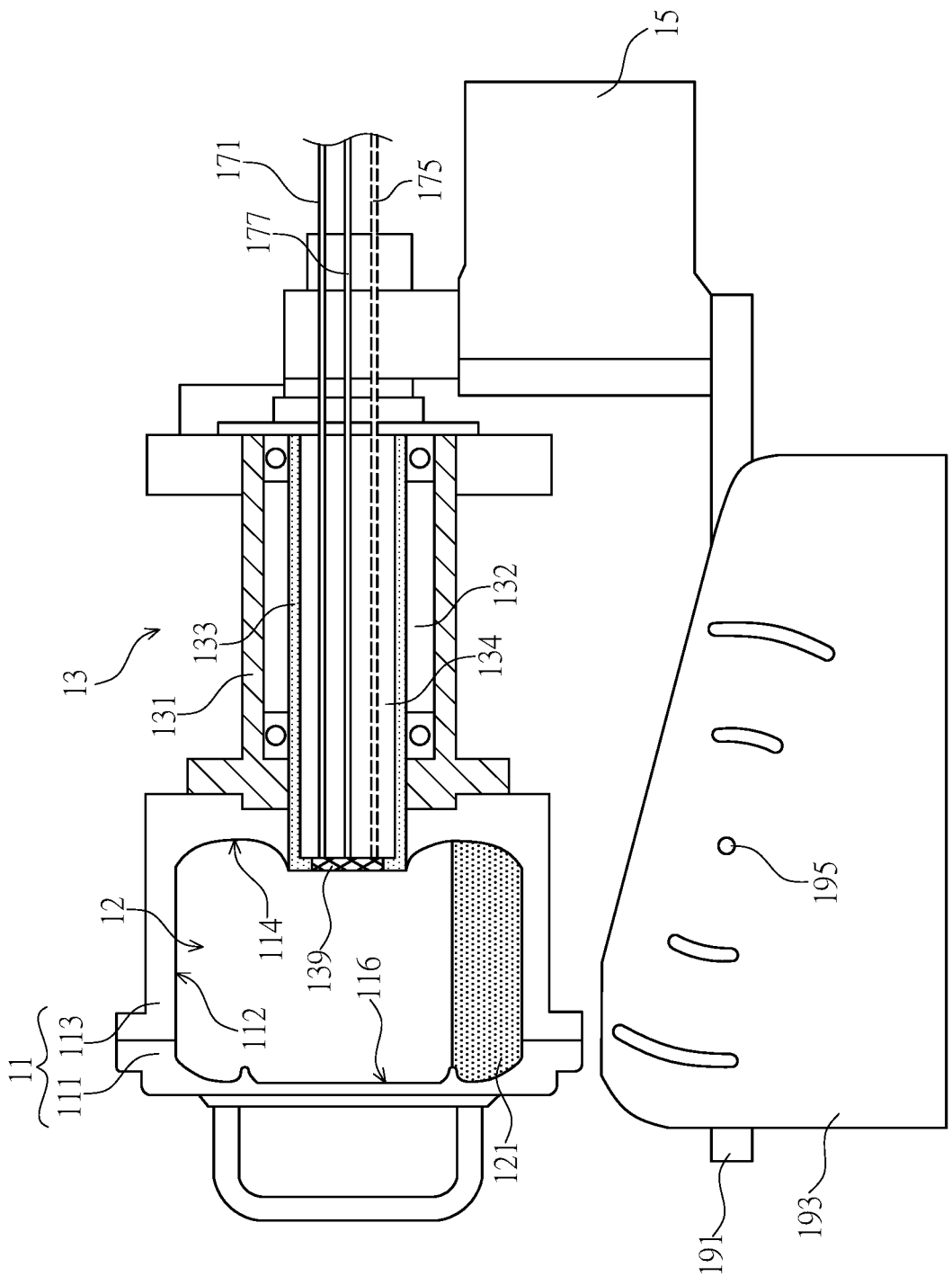
FIG. 2 is a cross-sectional schematic diagram of an atomic layer deposition apparatus for coating particles according to an embodiment of the present disclosure.

As shown in FIG. 2 and FIG. 3, the air extraction line 171, the air intake line 173, the non-reactive gas line 175, the heater 177 and/or the temperature sensing unit 179 are disposed in the connection space 134 of the inner tube 133.

The heater 177 is used to heat the connection space 134 and the inner tube 133. By heating the air extraction line 171, the air intake line 173 and/or the non-reactive gas line 175 in the inner tube 133 with the heater 177, temperatures of the gases in the air extraction line 171, the air intake line 173 and/or the non-reactive gas line 175 can be raised. For example, the temperature of non-reactive gas and/or precursor gas transported by the air intake line 173 to the reaction space 12 may be raised, and the temperature of non-reactive gas transported by the non-reactive gas line 175 to the reaction space 12 may be raised. As such, when the non-reactive gas and/or the precursor gas enter the reaction space 12, the temperature of the reaction space 12 would not drop or change drastically. Moreover, the temperature sensing unit 179 is used to measure the temperature of the heater 177 or the connection space 134 to monitor an operation status of the heater 177. Additional heating device is often disposed inside of, outside of, or surrounding the vacuum chamber 11, wherein the heating device is adjacent to or in contact with the vacuum chamber 11 for heating the vacuum chamber 11 and the reaction space 12.

The reaction space 12 of the present disclosure has a wavy circular columnar shape. The non-reactive gas transported by the air intake line 173 or the non-reactive gas line 175 to the reaction space 12 is delivered to various areas in and through the wavy circular columnar reaction space 12 and blows the particles 121 around in the reaction space 12, such that the particles 121 are evenly spread out and diffused to all regions of the reaction space 12. The particles 121 in the reaction space 12 are uniformly heated and thin films with uniform thickness are formed on the surface of the particles 121.

Figure 4:
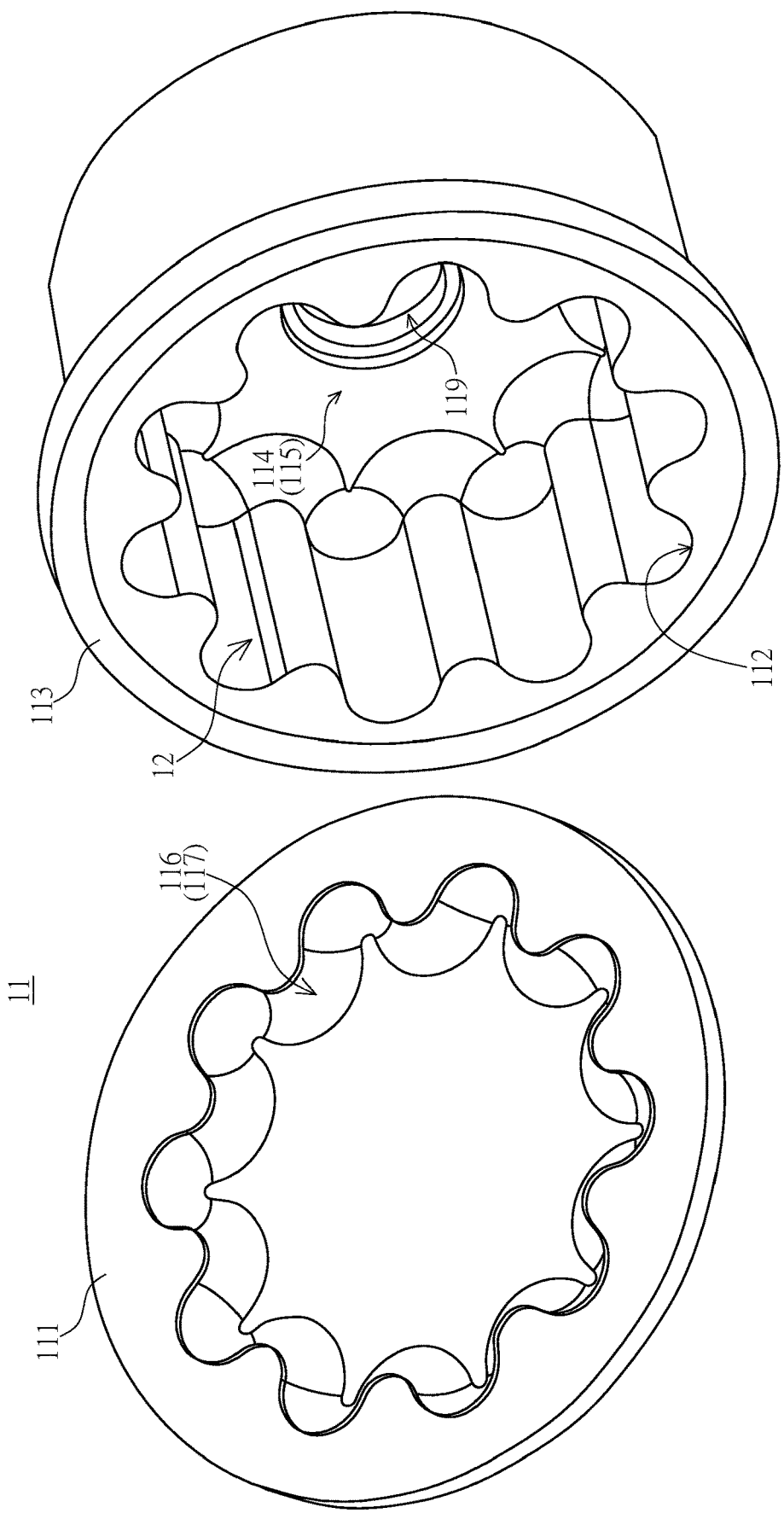
FIG. 4 is a schematic diagram illustrating a vacuum chamber of an atomic layer deposition apparatus for coating particles according to another embodiment of the present disclosure.

In specific, a plurality of semi-circular columnar structure or curved columnar structure may be formed on an inner side surface 112 of the vacuum chamber as shown in FIG. 4, wherein the semi-circular columnar structures or the curved columnar structures are disposed continually along the inner side surface 112 so that a cross-section of the reaction space 12 has a wavy circular formation.

Corresponding recesses 115/117 are respectively disposed on an inner bottom surface 114 and an inner top surface of the vacuum chamber 11. For example, the vacuum chamber 11 may have the wavy circular recess 117 disposed on the inner surface 116 of the cover lid 111 and the corresponding wavy circular recess 115 disposed on the inner bottom surface 114 of the chamber 113, wherein the wavy circular recesses 115/117 correspond to the wavy circular formation on inner side surface 112 of the vacuum chamber 11, such that the wavy circular recess 117 of the cover lid 111 and the wavy circular formation of the chamber 113 form a void with wavy circular columnar shape. The edges of the recesses 115/117 may be curved for guiding the non-reactive gas introduced into the reaction space 12 and the particles 121 carried by the non-reactive gas.

The particles 121 in the semi-circular columnar structure or the arched columnar structure on the inner side surface 112 rotate with the vacuum chamber 11 until a specific angle and then gradually fall or drop down due to gravity force. Therefore, the particles 121 in the reaction space 12 are fully and evenly stirred, such that each particle 121 is uniformly heated and a thin film with a uniform thickness is formed on the surface of each particle 121.

Figure 5:
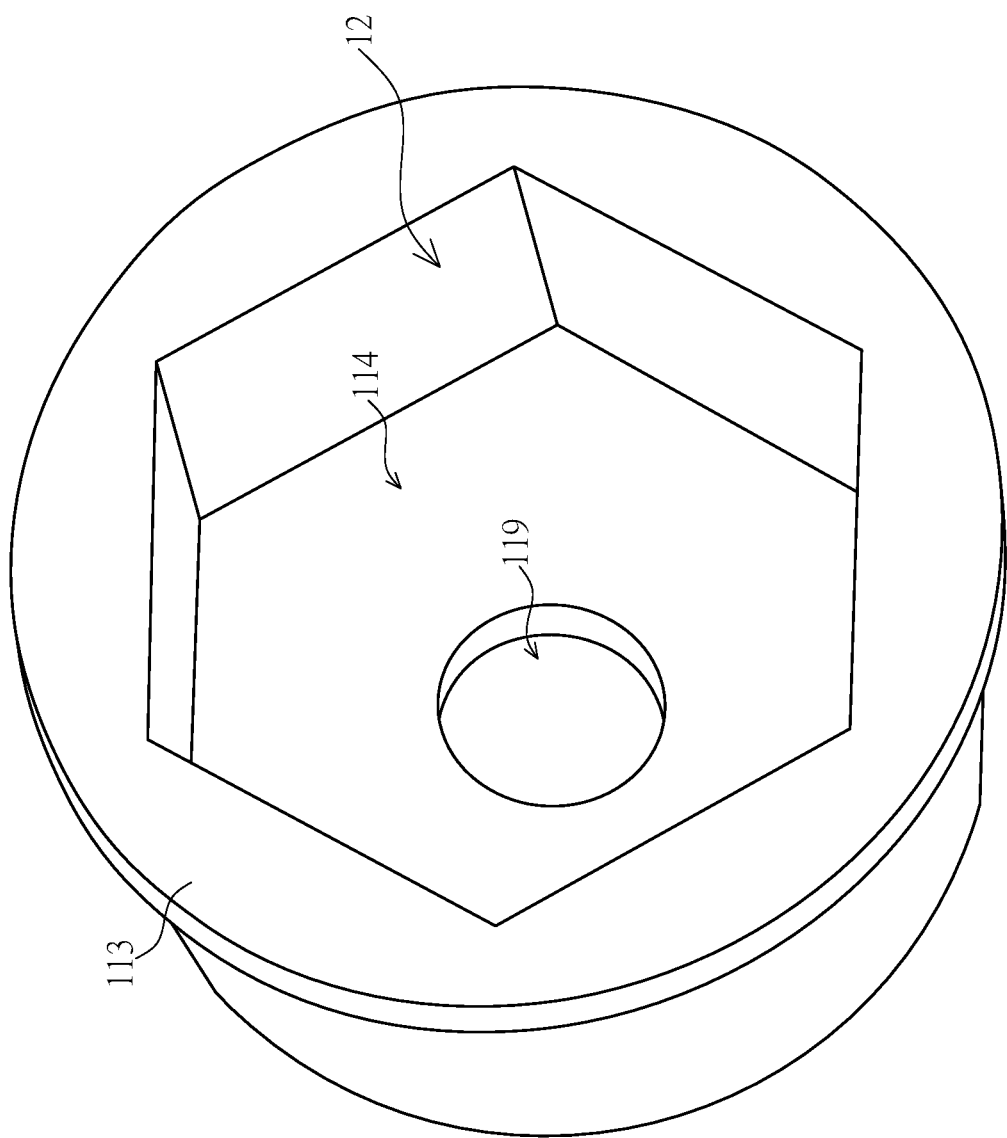
FIG. 5 is a schematic diagram illustrating a vacuum chamber of an atomic layer deposition apparatus for coating particles according to another embodiment of the present disclosure.

In another embodiment shown in FIG. 5, the reaction space 12 of the vacuum chamber 11 has a polygonal columnar shape like a hexagonal columnar shape. In particular, the vacuum chamber has a polygonal recess 117 disposed on the inner surface 116 of the cover lid 111, and the polygonal recess 117 corresponds to a polygonal formation on the inner side surface 112 of the vacuum chamber 11, wherein polygonal recess 117 of the cover lid 111 and the polygonal formation of the chamber 113 form a void with polygonal columnar shape. In different embodiments, there is no recess disposed on the inner surface 116 of the cover lid 111.

Figure 6:
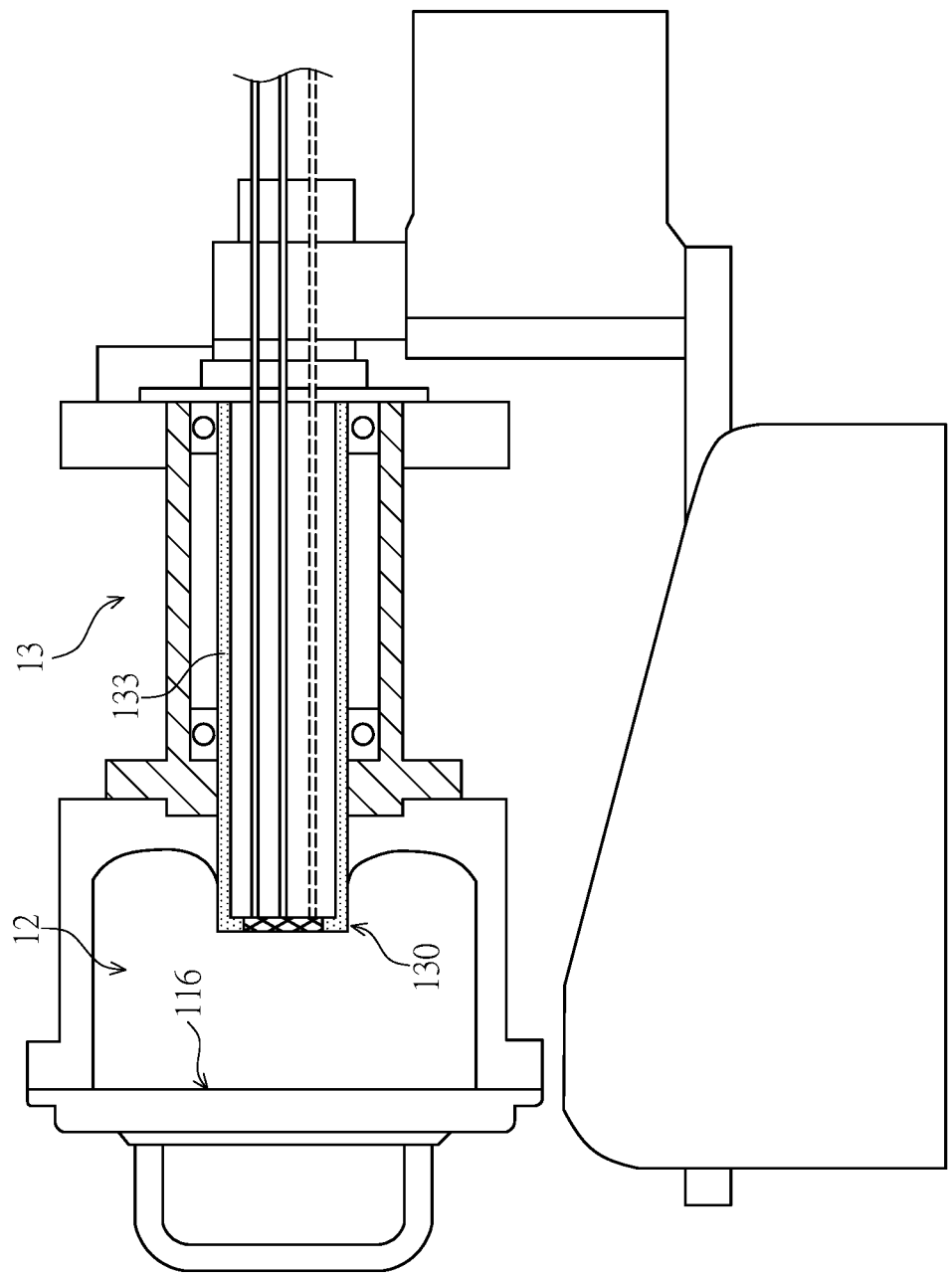
FIG. 6 is a cross-sectional schematic diagram of an atomic layer deposition apparatus for coating particles according to another embodiment of the present disclosure.

A through hole 119 is disposed on the inner bottom surface 114 of the chamber 113, as shown in FIG. 4 and FIG. 5, and a part of the shaft sealing device 13 is disposed in the through hole 119, like putting one end of the inner tube 133 of the shaft sealing device 13 in the through hole 119 as shown in FIG. 2. In different embodiments, the part of the shaft sealing device 13 may pass through the through hole 119 and be positioned in the reaction space 12. For example, the part of the inner tube 133 of the shaft sealing device 13 may pass through the through hole 119 and extend into the reaction space 12 to form a protruding tube part 130 in the reaction space 12 as shown in FIG. 6.

In one embodiment, the atomic layer deposition apparatus 10 for coating particles further includes a support base 191 and at least one mount bracket 193, wherein the support base 191 is a board body for placing the driving unit 15, the vacuum chamber 11, and the shaft sealing device 13 thereon. The support base 191 is connected to the driving unit 15, and is connected to the shaft sealing device 13 and the vacuum chamber 11 via the driving unit 15. The shaft sealing device 13 and/or the vacuum chamber 11 can also be connected to the support base 191 via at least one support member so as to enhance the stability of connection.

The support base 191 is connected to the mount bracket 193 via at least one connecting shaft 195, wherein the number of mount brackets 193 is two and the two mount brackets 193 are respectively disposed at two sides of the support base 191. The support base 191 is rotatable relative to the mount brackets 193 with the connecting shaft 195 as axis, so as to change an inclination angle of the driving unit 15, the shaft sealing device 13, and the vacuum chamber 11, and in turn assist in the formation of a thin film with a uniform thickness on the surface of each particle 121.

Figure 7:
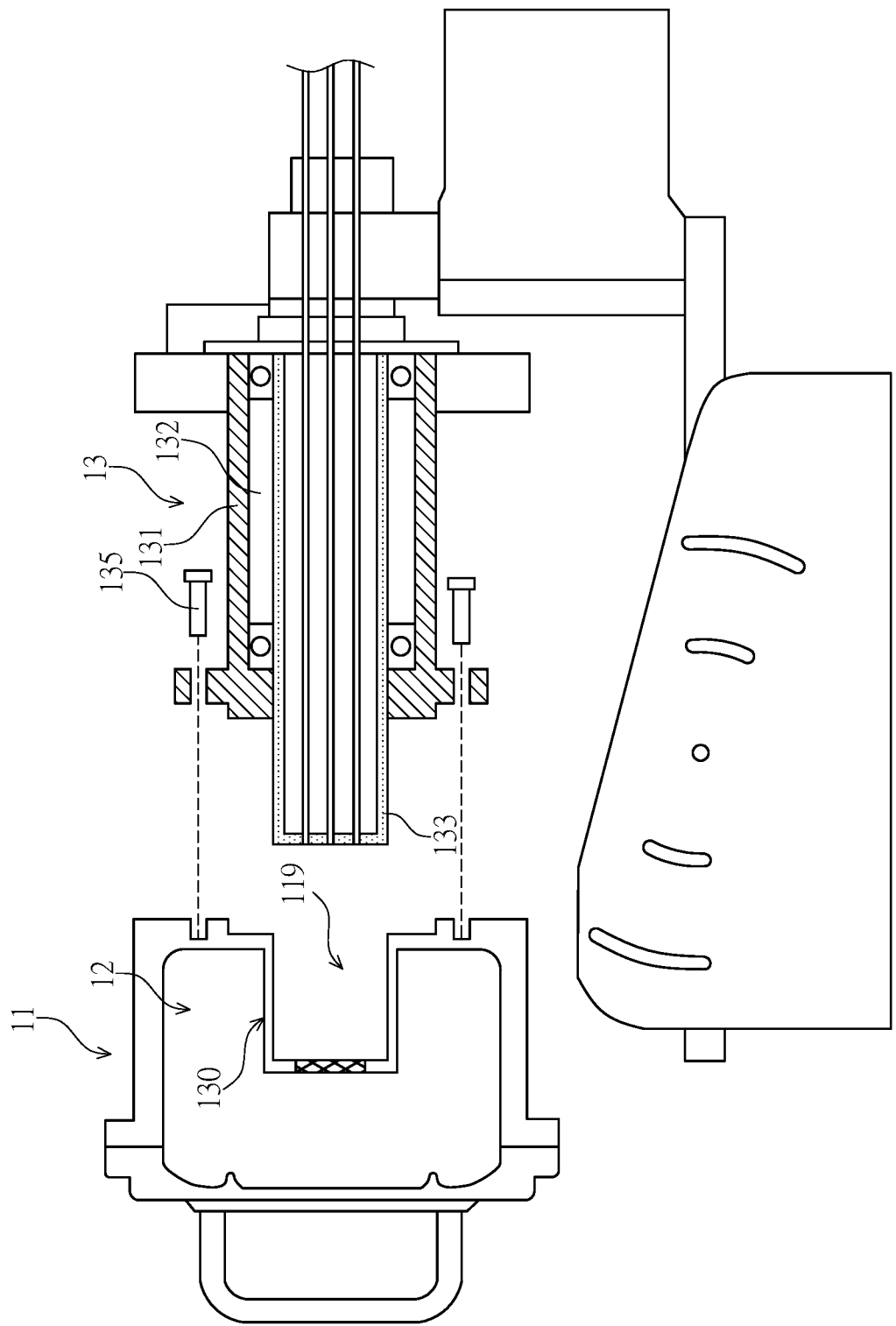
FIG. 7 is a cross-sectional exploded diagram of an atomic layer deposition apparatus for coating particles according to another embodiment of the present disclosure.

Referring to FIG. 7, the vacuum chamber 11 is connected to and fixed to one end of the shaft sealing device 13 via at least one fixing member 135 such as screws. The fixing member 135 being a screw is merely an example of the present disclosure, and in practice the vacuum chamber 11 may be fixed to the shaft sealing device 13 via the fixing member 135 of any formation. For example, the vacuum chamber 11 and the shaft sealing device 13 may be connected by a detachable fixing member 135 like a cylinder connector, a locking/snap mechanism, a latch, a fast-release device, screw threads, etc.

In one embodiment, the vacuum chamber 11 has a recess 119 disposed on a bottom of the vacuum chamber 11 for accommodating a part of the shaft sealing device 13, and the filter unit 139 is disposed in the recess 119, wherein the bottom of the vacuum chamber 11 faces the cover lid 111. The recess 119 extends from the bottom of the vacuum chamber 11 to the reaction space 12, and the inner tube 133 of the shaft sealing device 13 extends from the accommodating space 132 of the outer tube 131 to the outside and protrudes from the shaft sealing device 13 and the outer tube 131. When the vacuum chamber 11 and the shaft sealing device 13 are being connected, the part of the inner tube 133 protruding from the shaft sealing device 13 is inserted into the recess 119 so that the inner tube 133 and the recess 119 form the protruding tube part 130 in the reaction space 12.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

The invention claimed is:

1. An atomic layer deposition apparatus for coating particles, comprising:
 a vacuum chamber, comprising a reaction space for accommodating a plurality of particles, wherein the reaction space comprises a polygonal columnar shape;
 a shaft sealing device, comprising an outer tube and an inner tube, wherein the outer tube comprises an accommodating space for accommodating the inner tube;
 a driving unit, connected to the vacuum chamber via the outer tube of the shaft sealing device, wherein when the driving unit drives the vacuum chamber to rotate through the outer tube of the shaft sealing device, the inner tube does not rotate along therewith;
 at least one air extraction line, located within the inner tube and fluidly connected to the reaction space of the vacuum chamber, for extracting a gas from the reaction space; and
 at least one air intake line, located within the inner tube and fluidly connected to the reaction space of the vacuum chamber, for transporting a precursor or a non-reactive gas to the reaction space, wherein the non-reactive gas blows the particles around in the reaction space.

2. The atomic layer deposition apparatus of claim 1, wherein the vacuum chamber comprises a cover lid and a chamber, the cover lid comprises a polygonal recess disposed on an inner surface of the cover lid, the chamber comprises a polygonal space, and the polygonal recess of the cover lid and the polygonal space of the chamber form the reaction space having the polygonal columnar shape.

3. The atomic layer deposition apparatus of claim 1, wherein the air intake line comprises at least one non-reactive gas line fluidly connected to the reaction space of the vacuum chamber for transporting the non-reactive gas to the reaction space of the vacuum chamber to blow the particles around in the reaction space.

4. The atomic layer deposition apparatus of claim 3, wherein the inner tube comprises a connection space for accommodating the air extraction line, and the air intake line.

5. The atomic layer deposition apparatus of claim 4, wherein a part of the inner tube extends from the accommodating space of the outer tube into the reaction space of the vacuum chamber and forming a protruding tube part.

6. The atomic layer deposition apparatus of claim 4, wherein the air intake line or the non-reactive gas line extends from the connection space of the inner tube into the reaction space of the vacuum chamber.

7. The atomic layer deposition apparatus of claim 1, wherein a bottom of the vacuum chamber is fixed to the shaft sealing device via at least one fixing member, and the vacuum chamber separates from the shaft sealing device when the fixing member is dislodged.

8. The atomic layer deposition apparatus of claim 7, wherein the vacuum chamber comprises a recess, and the recess is disposed on the bottom of the vacuum chamber and extends from the bottom to the reaction space for accommodating a part of the shaft sealing device.

9. The atomic layer deposition apparatus of claim 8, further comprising a filter unit disposed in the recess of the vacuum chamber.

10. The atomic layer deposition apparatus of claim 1, wherein the vacuum chamber comprises a cover lid, and a chamber, and an inner surface of the cover lid covers the chamber to form the reaction space between the cover lid and the chamber.

* * * * *